United States Patent
Piazza et al.

(10) Patent No.: US 6,509,804 B2
(45) Date of Patent: Jan. 21, 2003

(54) LOW FREQUENCY QUARTZ OSCILLATOR DEVICE WITH IMPROVED THERMAL CHARACTERISTICS

(75) Inventors: Silvio Dalla Piazza, Saint-Imier (CH); Pinchas Novac, Neuchâtel (CH)

(73) Assignees: ETA SA Fabriques d'Ebauches (CH); EM Microelectronics - Marin SA (CH)

( * ) Notice: Subject to any disclaimer, the term of this patent is extended or adjusted under 35 U.S.C. 154(b) by 0 days.

(21) Appl. No.: 09/734,474

(22) Filed: Dec. 11, 2000

(65) Prior Publication Data

US 2001/0004226 A1 Jun. 21, 2001

(30) Foreign Application Priority Data

Dec. 21, 1999 (CH) ............................................. 2336/99

(51) Int. Cl.[7] ................................................. H03B 5/36
(52) U.S. Cl. ............................ 331/116 FE; 331/116 R; 331/158; 331/154; 310/316; 310/318; 310/361; 310/370
(58) Field of Search .......................... 331/116 FE, 154, 331/158, 116 R, 156; 310/361, 365, 367, 360, 316, 318, 348, 370

(56) References Cited

U.S. PATENT DOCUMENTS

| 4,320,320 A | 3/1982 | Momosaki |
| 4,437,773 A * | 3/1984 | Dinger et al. |
| 4,498,025 A | 2/1985 | Takahashi |
| 4,503,353 A * | 3/1985 | Hermann ..................... 310/361 |

FOREIGN PATENT DOCUMENTS

| EP | 0 657 994 A1 | 6/1995 |
| GB | 2 042 796 A | 9/1980 |

* cited by examiner

*Primary Examiner*—Arnold Kinkead
(74) *Attorney, Agent, or Firm*—Richard K. Robinson

(57) ABSTRACT

The present invention concerns a low frequency oscillator device including a quartz resonator (1) and an electronic maintenance circuit for maintaining the vibrations of said quartz resonator. According to the present invention, the quartz resonator is arranged to vibrate according to a torsional mode and therefore has a single cutting angle defined by a rotation at a determined angle ($\theta$) about the crystallographic axis X of the quartz crystal. This resonator includes in particular at least one undesired fundamental flexural vibrating mode at a first frequency and a desired fundamental torsional vibrating mode at a second frequency higher than said first frequency. Moreover, the electronic maintenance circuit is an inverter circuit (2) whose transconductance value ($g_m$) is determined such that said device cannot oscillate according to the undesired fundamental flexural vibrating mode but according to the desired fundamental torsional vibrating mode of said resonator. The oscillator device according to the present invention thus has substantially improved thermal characteristics with respect to known oscillator devices using flexural vibrating resonators.

8 Claims, 4 Drawing Sheets

LOW FREQUENCY QUARTZ OSCILLATOR DEVICE WITH IMPROVED THERMAL CHARACTERISTICS

BACKGROUND OF THE INVENTION

The present invention generally concerns a low frequency quartz oscillator device.

In the following description, "quartz oscillator device" means an oscillator device including a quartz resonator associated with oscillating means, or an electronic circuit for maintaining the vibrations of the resonator.

Those skilled in the art know various types of quartz oscillator devices. Those skilled in the art know, in particular, oscillator devices using a quartz resonator arranged to vibrate according to a flexural vibration mode. Such resonators typically have parabolic type thermal characteristics and are relatively sensitive to temperature variations.

In order to overcome this drawback, those skilled in the art know that the sensitivity of such oscillators to changes in temperature can be compensated for or at least reduced by additional means, or a temperature compensation circuit. In addition to the fact that these additional means increase the cost of such oscillators, it is to be noted that the power consumption of these devices is also substantially increased. Moreover, these additional temperature compensation means typically operate by adjusting the load capacitor or capacitors of the resonator or by adding or eliminating oscillation pulses. This has the effect of greatly degrading the purity of the frequency spectrum of the oscillation signal. Indeed, the appearance of a large number of spectrum lines of quite significant width is observed, the position of these lines also varying with the temperature.

These oscillator devices cannot be used in cases where it is necessary to have an oscillation signal having not only a temperature stable frequency but also a frequency spectrum including only a low number of spectrum lines. A signal having these properties is for example necessary in telecommunications to allow a synchronisation operation.

Those skilled in the art also know oscillators including a so-called AT cut quartz resonator with cubic type thermal characteristics and whose frequency is very stable as a function of the temperature. However, by nature, this frequency is quite high, of the order of several MHz. Consequently, in order to use such an oscillator device to supply a low frequency oscillation signal, the oscillator needs to be fitted with a frequency divider circuit, which complicates and increases the cost of the device. Furthermore, the electric power consumed by the frequency divider circuit is relatively significant because of the high frequency of the signal which it receives at its input, which proves to be a serious drawback when the power has to be supplied by an autonomous power source of small dimensions such as a wristwatch battery.

A general object of the present invention is thus to propose a quartz oscillator device which overcomes the aforementioned drawbacks, i.e. an oscillator device which generates an oscillation signal having good thermal characteristics and good spectral purity and which preferably consumes little power.

The present invention therefore concerns a quartz oscillator the features of which are listed in claim 1.

The present invention thus proposes, firstly, using a torsional type quartz resonator, i.e. a resonator arranged to vibrate according to a torsional vibration mode. According to the present invention, this resonator is, in particular, a resonator of the type described in the article by Messrs. Roger Bourquin and Philippe Truchot entitled "Barreaux de quartz vibrant en mode de torsion, Application aux capteurs", 6th European Chronometry Congress, Bienne, 17–18 October 1996, which is incorporated herein by reference.

FIG. 1 annexed hereto shows a non limiting example of such a torsional type resonator, globally indicated by the numerical reference 1. This resonator 1 has the shape of a tuning fork obtained by chemical etching or mechanical machining of a quartz plate along a determined cutting angle so that the branches of the resonator are oriented in the crystallographic plane YZ of the quartz crystal at a determined angle θ as is shown clearly in FIG. 1.

This type of resonator has the advantage of better thermal characteristics compared to conventional flexural vibrating resonators. In particular, the thermal characteristics of this torsional vibrating resonator are determined by the cutting angle and by the thickness over width ratio (t/w) of the arm. By way of example, a torsional θ vibrating tuning fork resonator made in accordance with the teaching of the aforementioned article allows better thermal stability to be obtained, of the order of a factor of 3, compared to a conventional flexural vibrating tuning fork resonator.

It will be noted that there is also known another type of resonator arranged to vibrate according to a torsional mode. This other torsional vibrating resonator is known by the name of a TT-cut torsional quartz resonator. Such a resonator is for example described in the article by Messrs. Hirofumi Kawashima and Mitsuhiro Nakazato entitled "TT-Cut Torsional Quartz Crystal Resonator", 45th Annual Symposium on Frequency Control "ASFC), IEEE, 1991.

Unlike the torsional vibrating resonator of the preceding article, which is used within the scope of the present invention, this resonator is characterised by two cutting angles and requires a more complex electrode structure. In terms of manufacturing simplicity and cost, the torsional vibrating resonator described in the aforementioned article by Messrs. Bourquin and Truchot thus constitutes a more advantageous solution.

It will be noted however that a drawback of the torsional vibrating resonator described in the first aforementioned article resides in the fact that, in addition to the desired fundamental torsional vibrating mode, it has undesired flexural vibrating modes. As will be seen in detail hereinafter, this type of resonator has, in particular, a fundamental flexural vibrating mode at a substantially lower frequency than the frequency of the desired torsional vibrating mode. Consequently, if a resonator of this type is associated with a conventional electronic maintenance circuit, the assembly will in practice oscillate according to this fundamental flexural mode and not according to the desired fundamental torsional mode.

SUMMARY OF INVENTION

The present invention thus also proposes to answer this drawback of the aforementioned torsional vibrating resonator, namely to provide an electronic maintenance circuit for the resonator vibrations assuring that the resonator actually vibrates according to the desired fundamental torsional vibrating mode.

According to a particularly advantageous embodiment of the resonator, the geometry of the resonator is selected so that the desired fundamental torsional vibrating mode is located substantially close to 393,216 kHz, i.e. 12 times the frequency of 32,768 kHz which is the typically frequency of a quartz resonator intended for horological applications.

These objects, features and advantages of the present invention, in addition to others, will appear more clearly upon reading the following detailed description, made with reference to the annexed drawings, given by way of non limiting example and in which:

DETAILED DESCRIPTION OF THE INVENTION

We will first of all dwell briefly on the torsional vibrating quartz resonator used as a resonator in the oscillator device according to the present invention. More ample information may be found in the article by Messrs. Roger Bourquin and Philippe Truchot already mentioned above.

With reference again to FIG. 1, the torsional vibrating quartz resonator is advantageously made in the form of a tuning fork obtained by mechanical machining or chemical etching of a quartz plate at a determined cutting angle. It will be noted that this particular embodiment is in no way limiting and that other geometries of the resonator can be envisaged. This resonator can thus alternatively be made in the form of a single bar or in the form of two bars mounted symmetrically and opposite to each other around a central fitting.

Figure 1:
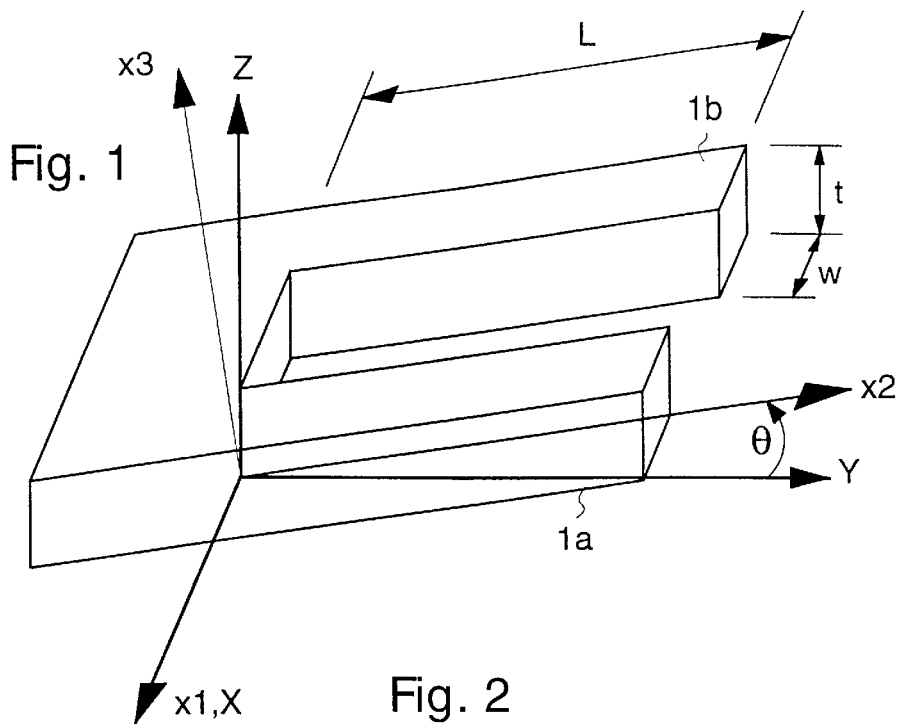
FIG. 1 which has already been mentioned, shows an example of a torsional vibrating quartz resonator used within the scope of the present invention and taking the form of a tuning fork whose arms are oriented in crystallographic plane YZ.

The tuning fork resonator of FIG. 1, globally designated by the numerical reference 1, includes two arms 1a and 1b of rectangular cross-section (thickness t, width w) and of length (L) oriented in the crystallographic plane YZ. FIG. 1 also illustrates a referential (x1; x2; x3) associated with resonator 1 so that length L is defined along the axis x2 and the thickness t is defined along axis x3. In particular, this referential (x1; x2; x3) associated with resonator 1 is oriented with respect to crystallographic axes X, Y and Z so that axis x1 is identical to crystallographic axis X, and axes x2 and x3 each form a determined angle θ with respect to crystallographic axes Y and Z respectively.

Resonator 1 used within the scope of the present invention thus has a single cutting angle defined by a rotation at a determined angle θ about crystallographic axis X of the quartz crystal.

It will be understood from the article by Messrs. Bourquin and Truchot that the thermal characteristics of the resonator are determined by the angle of orientation of the resonator (angle θ) and by the thickness (t) over width (w) ratio, or cross-section ratio, of the resonator arm. In particular, the angle of orientation θ and the cross-section ratio are selected so that the first order thermal characteristics or linear coefficient is substantially zero. In practice, this result may for example be obtained, with an angle of orientation θ of +32° and a cross-section ratio of the order of 0.6.

The Applicant was thus able to observe that by making a tuning fork resonator in accordance with the teaching of Messrs. Bourquin and Truchot, the thermal characteristics of the resonator are improved of the order of a factor of 3 with respect of a flexural vibrating resonator.

It is important to note that, in addition to the desired fundamental torsional vibrating mode, also designated hereinafter the "fundamental torsional mode", this resonator includes undesired flexural vibrating modes. In particular, this resonator includes a first undesired mode, namely a fundamental flexural vibrating mode, also designated hereinafter by the term "fundamental flexural mode" located at a substantially lower frequency than the frequency of the desired fundamental torsional mode. This resonator further includes another undesired vibrating mode which should also be considered, namely another flexural vibrating mode, designated hereinafter by the term "first flexural overtone", located at a relatively close frequency to the frequency of the desired fundamental torsional mode.

Preferably, the dimensions of the resonator, namely the dimensions t, w and L of the resonator arm, are selected so that the desired fundamental torsional mode is located between the aforementioned fundamental flexural mode and the first flexural overtone mode. As will be seen in more detail hereinafter, this is preferable to ensure proper operation of the oscillator device according to the present invention.

Figure 2:
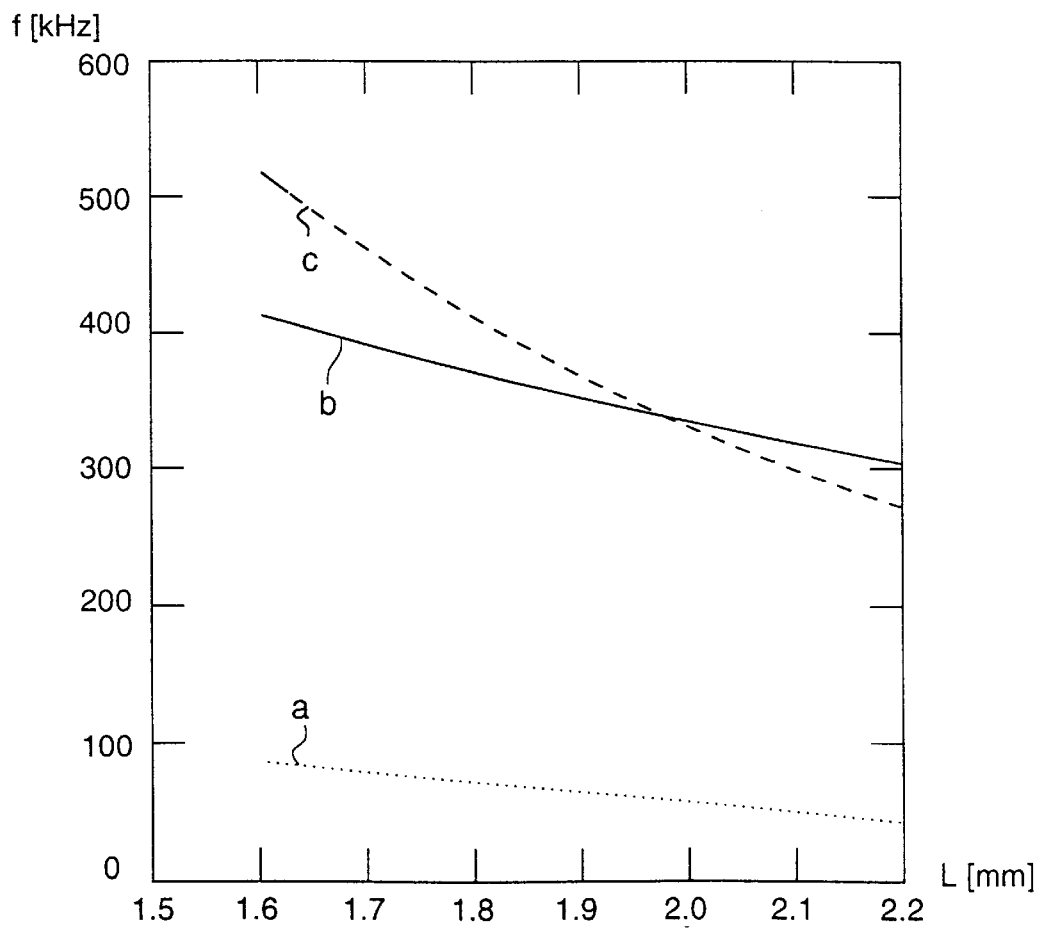
FIG. 2 shows, in the case of a specific embodiment of the resonator of FIG. 1, the evolution of the frequency of three of its main vibrating modes as a function of the length of the resonator arm, these three vibrating modes being the fundamental torsional vibrating mode; the fundamental flexural vibrating mode; and the first flexural overtone.

By way of illustration, FIG. 2 shows the evolution of the frequency of each of the aforementioned vibrating modes as a function of length L of the arm for a specific embodiment of the tuning fork resonator wherein the dimensions of the arms are in particular w=220 μm and t=136 μm. In this Figure, the curve marked "a" illustrates the evolution of the frequency of the fundamental flexural mode, the curve marked "b" illustrates the evolution of the frequency of the fundamental torsional mode and the curve marked "c" illustrates the evolution of the frequency of the first flexural overtone.

By way of non limiting but particularly advantageous example, the geometry of the tuning fork resonator of FIG. 1 is further selected so that the desired fundamental torsional mode is located substantially in proximity to 393,216 kHz, i.e. 12 times the frequency of 32,768 kHz which is the typical frequency of a quartz resonator intended for horological applications. In the illustration of FIG. 2, this result is for example obtained for an arm length L of approximately 1.68 mm.

It will of course be noted that the dimensions indicated above are given solely by way of illustration and are non limiting. Other dimensions may also be selected to fulfil the conditions dictated by the desired applications.

According to the specific embodiment used here by way of example, the tuning fork resonator thus includes a desired fundamental torsional mode located substantially at 393,216 kHz. In accordance with the illustration of FIG. 2, this resonator further includes an undesired fundamental flexural mode, whose frequency is located substantially in proximity to 74 kHz, and a first flexural overtone, which is also undesired, whose frequency is located substantially in proximity to 435 kHz.

According to current practice, the maintenance circuits of the vibrations of the resonator are typically designed so that the oscillator device oscillates according to the first vibrating mode of the resonator, i.e. commonly the vibrating mode with the lowest frequency. This is typically the case of oscillator devices using flexural vibrating resonators. In the particular case which concerns us here, the resonator has a first vibrating mode, namely a fundamental flexural vibrating mode, which is an undesired mode. The association of a conventional maintenance circuit and the torsional vibrating resonator used within the scope of the present invention will typically lead to the oscillator device not oscillating according to the desired mode, namely the fundamental torsional mode whose frequency is located substantially at 393,216 kHz, but according to the first vibrating mode of the resonator, namely the undesired fundamental flexural mode whose frequency is located in proximity to 74 kHz. The explanation of this problem is provided in the description which follows.

Figure 3A:
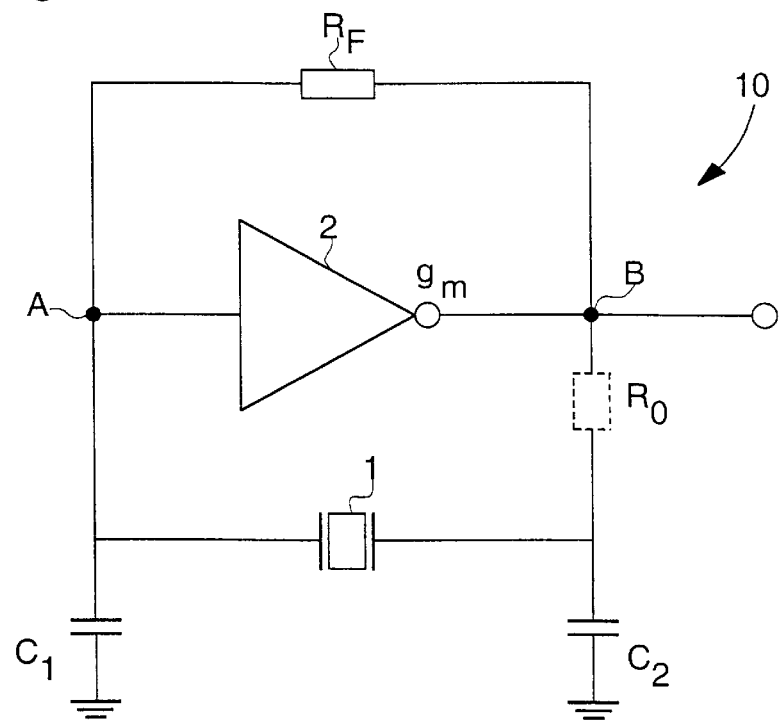
FIG. 3a shows schematically an inverter oscillator device used within the scope of the present invention.

FIG. 3a shows schematically an oscillator device 10 including an inverting amplifier 2 having a transconductance value $g_m$, a resonator 1, connected in the feedback path of inverter 2, a first load capacitor $C_1$ connected at input A of inverter 2, and a second load capacitor $C_2$ connected at output B of inverter 2. Oscillator device 10 further includes a feedback resistor $R_F$ connected across input A and output B. Typically the value of this feedback resistor $R_F$ is selected to be very high and its influence on the operation of the oscillator device is generally ignored.

By way of improvement, the oscillator device of FIG. 3a may further include an additional resistor $R_0$ arranged across output B of inverter 2 and load capacitor $C_2$. This resistor is intended to ensure an improvement in the stability of the oscillator device.

Figure 3B:
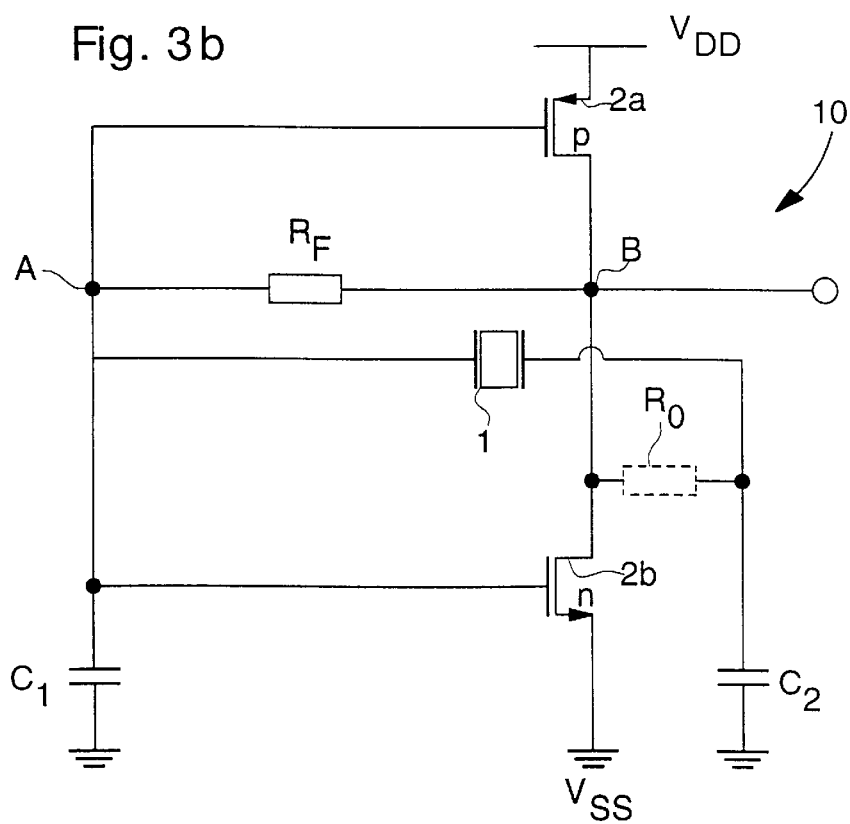
FIG. 3b shows an example embodiment of the oscillator device of FIG. 3a including a CMOS inverter.

A possible embodiment of the oscillator device of FIG. 3a is shown in FIG. 3b. According to this embodiment, inverting amplifier 2 is for example a CMOS inverter including a first p-type transistor 2a and a second n-type transistor 2b which are connected drain to drain across an earth potential $V_{SS}$ and a power supply potential $V_{DD}$ and whose gate terminals are connected to each other. In such a case, the transconductance $g_m$ of inverting amplifier 2 is equal to the sum of the transconductances of p-type and n-type transistors 2a and 2b.

A detailed explanation of the operation of a device like the oscillator device of FIG. 3b can for example be found in the article by Mr. Andreas Rusznyak, "Start-Up time of CMOS Oscillators", IEEE Transactions on Circuits and Systems, vol. cas-34, no. 3, March 1987.

Figure 4:
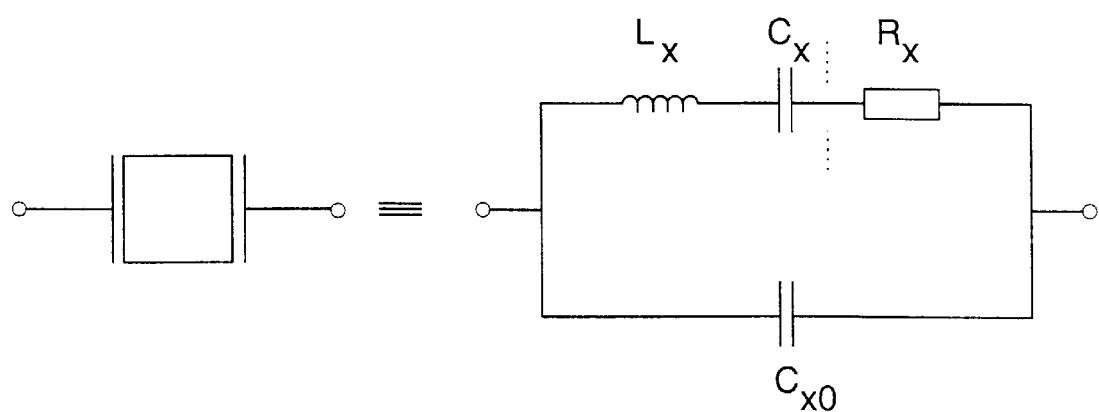
FIG. 4 shows an equivalent electric diagram of a quartz resonator.

It is well known from the literature that resonator 1 can be represented by its equivalent electric circuit as illustrated in FIG. 4. According to this diagram, resonator 1 includes a series branch including a large inductor $L_X$, a small capacitor $C_X$ and a series resistor $R_X$, and, connected in parallel with the series branch, a so-called static capacitor $C_{X0}$. It is to be noted that the equivalent circuit of FIG. 4 is valid close to a given vibrating mode of the resonator and that a specific series branch $L_X$, $C_X$, $R_X$ corresponds to each given vibrating mode of the resonator.

It will be noted that inductor $L_X$ and capacitor $C_X$ are representative of the dynamic behaviour of the vibrating mode of the resonator being considered and that series resistor $R_X$ represents the resonator losses. It will also be noted that the value of static capacitor $C_{X0}$ is typically much higher than the value of capacitor $C_X$ of the series branch. It can thus be defined that the (angular) frequency of the oscillations of the device is substantially equal to:

$$\omega \cong \frac{1}{\sqrt{L_x C_x}} \quad (1)$$

The conditions necessary for the oscillation of the oscillator device to actually occur according to a given vibrating mode may thus be defined as follows.

According to a first of these conditions, transconductance $g_m$ of the oscillator device must be higher than the critical transconductance or minimum transconductance $g_{m,min}$ defined in equation (2) below:

$$g_{m,min} = \left(2 + \frac{C_1}{C_2} + \frac{C_2}{C_1}\right)\left[\omega^2 R_x \left(C_0 + \frac{C_1 C_2}{C_1 + C_2}\right)^2 + \frac{1}{R_F}\right] \quad (2)$$

where $\omega$ is the (angular) resonant frequency for the vibrating mode concerned and $C_0$ is the value of the capacitor present in parallel with resonator 1 and includes in particular the value of static capacitor $C_{X0}$ of the resonator. For the design of load capacitors $C_1$ and $C_2$, account will also have to be taken of the influence of parasitic capacitors present in parallel with these load capacitors at the input and output of the inverting amplifier. By way of example, the value of capacitor $C_0$ is estimated in this particular case to be 1 pF and the values of capacitors $C_1$ and $C_2$ are dimensioned so as to have values of 12 pF and 28 pF respectively.

As a complement to condition (2) expressed hereinabove, a second condition must be fulfilled by transconductance $g_m$ so that oscillation of the oscillator device occurs. The oscillation of the device is in fact not possible unless transconductance $g_m$ of the inverting amplifier is less than maximum transconductance $g_{m,max}$ defined according to the following equation (3):

$$g_{m,max} = \frac{C_1 C_2}{R_x C_0^2 + 1/(\omega^2 R_F)} \quad (3)$$

Generally speaking, it will be noted that the value of the maximum transconductance $g_{m,max}$ is typically higher than the value of the critical transconductance $g_{m,min}$.

The conditions for oscillation of the device may be summarised as follows:

$$g_{m,min} < g_m < g_{m,max} \quad (4)$$

If condition (4) expressed above is simultaneously fulfilled for several vibrating modes, one knows that the device will only oscillate in practice according to the vibrating mode having the lowest critical transconductance $g_{m,min}$. In the case which concerns us, the desired vibrating mode of the resonator, namely the fundamental torsional vibrating mode, is located at a frequency (393,216 kHz) substantially higher than the frequency of the undesired fundamental flexural vibrating mode (at 74 kHz). Critical transconductance $g_{m,min}$ of the undesired fundamental flexural mode is thus typically less than the critical transconductance $g_{m,min}$ of the desired fundamental torsional mode. Consequently, the device will typically only oscillate according to the undesired fundamental flexural mode.

In order to answer this problem, and contrary to current practice, the dependence of critical transconductance $g_{m,min}$ and maximum transconductance $g_{m,max}$ as regards the value of feedback resistor $R_F$ in equations (2) and (3) above is exploited in order to avoid the device oscillating according to the undesired flexural vibrating mode.

It can be observed that critical transconductance $g_{m,min}$ decreases very substantially when the value of feedback resistor $R_F$ increases to quickly reach a substantially constant value determined by the characteristics of the resonator and load capacitors $C_1$ and $C_2$. In particular, for values of feedback resistor $R_F$ such as:

$$R_F \gg \frac{1}{\omega^2 R_x \left(C_0 + \frac{C_1 C_2}{C_1 + C_2}\right)^2} \quad (5)$$

the expression (2) of critical transconductance $g_{m,min}$ can be substantially reduced to the following simplified expression (6).

$$g_{m,min} \cong \omega^2 R_x \frac{[C_1 C_2 + C_0(C_1 + C_2)]^2}{C_1 C_2} \quad (6)$$

It can thus be observed that the value of critical transconductance $g_{m,min}$ essentially depends, for each vibrating mode considered, on the factor $\omega^2 R_x$. It is thus essentially the characteristics of the resonator, namely the frequency of the mode considered and the value of its series resistor which determine critical transconductance value $g_{m,min}$.

Likewise, it may be observed that maximum transconductance $g_{m,max}$ substantially decreases when the value of feedback resistor $R_F$ decreases to reach a value substantially proportional to the value of this feedback resistor $R_F$. In particular, for values of feedback resistor $R_F$ such as:

$$R_F \ll \frac{1}{\omega^2 R_X C_0^2} \quad (7)$$

the expression (3) of maximum transconductance $g_{m,max}$ can be reduced substantially to the following simplified expression (8):

$$g_{m,max} \cong C_1 C_2 \omega^2 R_F \quad (8)$$

It can thus be observed, in this case, that maximum transconductance value $g_{m,max}$ essentially depends, for each vibrating mode considered, on the factor $\omega^2 R_F$. It is thus essentially the frequency of the mode considered and the value of feedback resistor $R_F$ which determine maximum transconductance $g_{m,max}$. It can thus be seen that the lower the frequency of the vibrating mode considered, the lower maximum transconductance $g_{m,max}$.

Let us take, by way of illustration, the particular embodiment of the resonator, mentioned hereinabove, used within the scope of the present invention, namely the resonator having a fundamental flexural mode located close to 74 kHz, a fundamental torsional mode located substantially at 393, 216 kHz and a first flexural overtone located close to 435 kHz. According to this specific embodiment of the resonator, the value of series resistors $R_X$ are estimated for each of these modes at a mean of approximately 56 k$\Omega$, 8 k$\Omega$ and 23 k$\Omega$ respectively.

Figure 5:
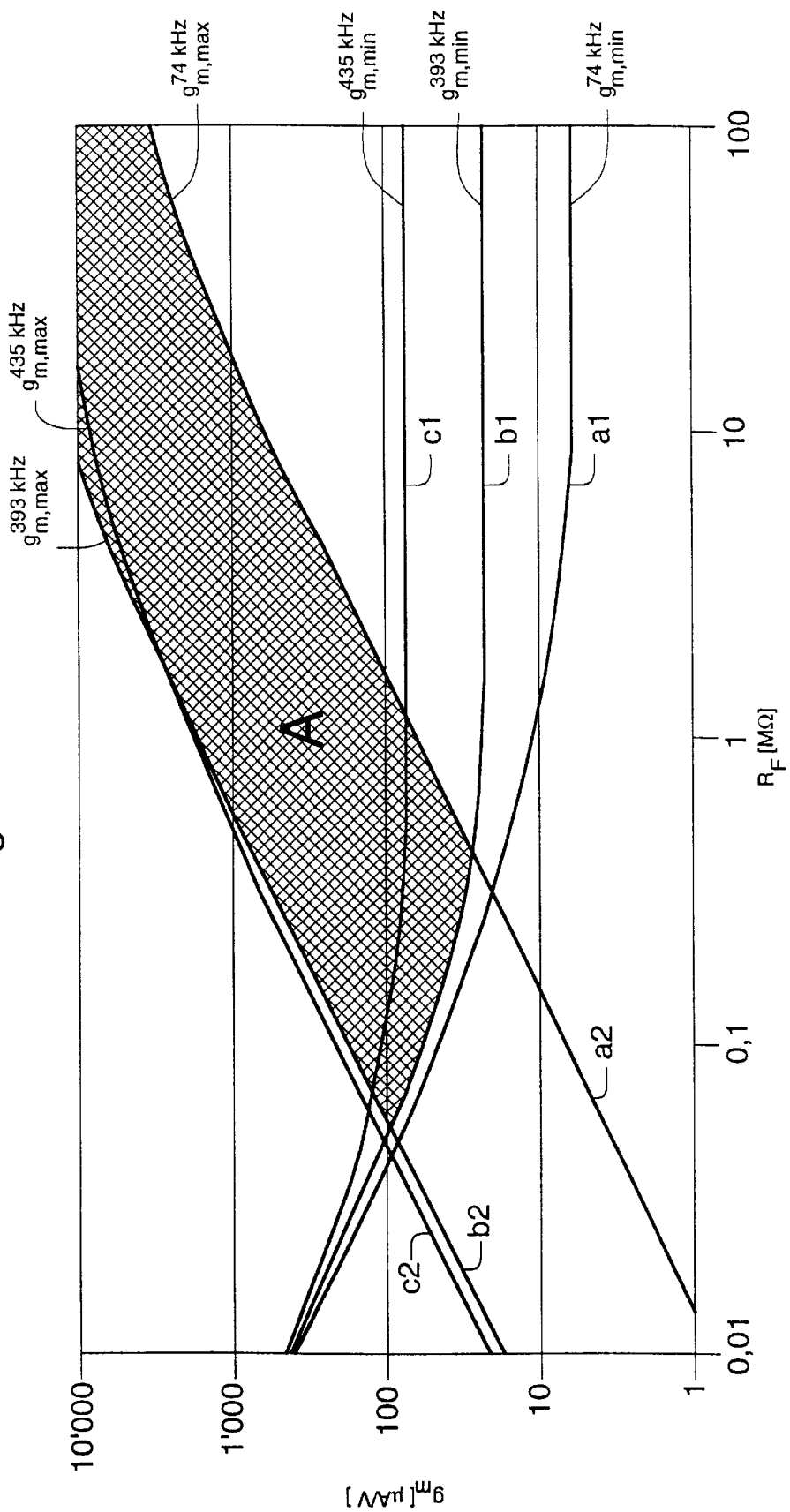
FIG. 5 is a graph illustrating the limit oscillation conditions $g_{m,min}$ and $g_{m,max}$ for each of the three main considered vibrating modes of the resonator used within the scope of the present invention as a function of the value of the feedback resistor $R_F$ of the electronic maintenance circuit.

FIG. 5 shows a graph of the evolution of critical transconductance $g_{m,min}$ and maximum transconductance $g_{m,max}$ as a function of the value of feedback resistor $R_F$. The curves $a_1$, $b_1$ and $c_1$ thus represent the evolution of critical transconductance $g_{m,min}$ for each of the aforementioned vibrating modes, namely respectively the fundamental flexural mode, the fundamental torsional mode and the first flexural overtone. Likewise, curves $a_2$, $b_2$ and $c_2$ represent the evolution of maximum transconductance $g_{m,max}$ for each of the three vibrating modes considered.

According to the present invention, in order to assure that the device oscillates in the desired fundamental torsional mode, the following conditions must be satisfied.

In order to ensure that the device oscillates in the desired mode, namely the fundamental torsional mode, transconductance $g_m$ of the device must first satisfy the general condition (4) set out above, i.e. in the particular case taken by way of example:

$$g_{m,min}^{393kHz} < g_m < g_{m,max}^{393kHz} \quad (9)$$

Moreover, in order to avoid the device oscillating according to the undesired flexural mode, transconductance $g_m$, of the device must also be higher than maximum transconductance $g_{m,max}$ of the undesired fundamental flexural mode, i.e. in the particular case taken by way of example:

$$g_{m,max}^{74kHz} < g_m \quad (10)$$

In the present case, one should also ensure that critical transconductance $g_{m,min}$ of the desired fundamental torsional mode is less than critical transconductance $g_{m,min}$ of the first flexural overtone. Otherwise, the device would oscillate according to the first flexural overtone mode. In the particular case taken by way of example, this condition can be expressed as follows:

$$g_{m,min}^{393 kHz} < g_{m,min}^{435 kHz} \quad (11)$$

FIG. 5 shows, in grey zone A, all the transconductance values $g_m$ satisfying conditions (9) and (10) above. Condition (11) is satisfied by a suitable selection of the resonator characteristics. In particular, as was already mentioned, the resonator is preferably designed so that the frequency of the desired fundamental torsional mode is located below the frequency of the undesired first flexural overtone. Very particular attention should thus be paid to making the resonator and to ensuring that the values of series resistor $R_X$ of these vibrating modes are such that the equation (11) above remains satisfied.

It will have been understood from the foregoing that careful selection of the value of feedback resistor $R_F$ allows conditions (9) and (10) to be fulfilled while assuring a relatively low transconductance value $g_m$, which is preferable from the point of view of power consumption. In the present case, illustrated in FIG. 5, a value of feedback resistor $R_F$ of the order of 700 to 800 k$\Omega$ is chosen which allows the maximum transconductance relative to the undesired fundamental flexural mode to be reduced to several tens of $\mu$A/V. For this same value of feedback resistor $R_F$, the maximum transconductance relative to the desired fundamental torsional mode is of the order of several mA/V and thus assures sufficient tolerance over transconductance $g_m$ of the device.

According to the present invention, an oscillator device is thus arranged to oscillate according to the fundamental torsional vibrating mode of the quartz resonator.

Consequently, the temperature characteristics of the oscillator device according to the present invention are substantially improved with respect to a conventional oscillator device using a flexural vibrating quartz resonator.

By way of advantageous variant, the oscillator device may be provided with a divider circuit connected at the output B of the maintenance circuit. In particular, in the specific case of the oscillator device taken here by way of example, namely an oscillator device arranged to supply an oscillation signal at 393,216 kHz, this signal may advantageously be applied at the input of a divider-by-twelve circuit so as to derive an oscillation signal having a frequency substantially equal to 32,768 kHz, this signal being particularly useful for horological applications.

Generally, the resonator will be made so that the desired fundamental torsional vibrating mode is located at a frequency equal to a multiple of 32,768 kHz.

In practice, the oscillator device according to the present invention will also advantageously be made in the form of a single compact component including for example a ceramic, metal or plastic case in which the quartz resonator and the electronic vibration maintenance circuit are arranged.

It will be understood that various modifications and/or adaptations may be made to the oscillator device described in the present description without however departing from the scope of the invention defined by the annexed claims.

What is claimed is:

1. A low frequency oscillator device including a quartz resonator and an electronic maintenance circuit for maintaining the vibrations of said quartz resonator, wherein:

said quartz resonator has a single cutting angle defined by a rotation at a determined angle about the crystallographic axis X of said quartz, so that said resonator includes at least one fundamental flexural vibrating mode at a first frequency and a fundamental torsional vibrating mode at a second frequency higher than said first frequency; and said electronic maintenance circuit for maintaining the vibrations of the resonator is an inverting amplifier circuit whose transconductance value is determined such that said device cannot oscillate according to said fundamental flexural vibrating mode but according to said fundamental torsional vibrating mode of said resonator said inverting amplifier circuit including an input at which is connected a first load capacitor and an output at which is connected a second load capacitor, said quartz resonator being connected in the feedback path of said inverting amplifier, said electronic maintenance circuit also including a feedback resistor connected across the input and the output of said inverting amplifier, the value of said feedback resistor being determined so as to substantially reduce the maximum transconductance value relative to the fundamental flexural vibrating mode of the resonator.

2. An oscillator device according to claim 1, wherein said resonator also includes another flexural vibrating mode, called the first flexural overtone mode, at a third frequency higher than the frequency of said fundamental torsional vibrating mode.

3. An oscillator device according to claim 1, wherein said inverting amplifier is a CMOS inverter including, connected in series between a power supply potential and an earth potential, a first p type transistor and a second n type transistor whose drains are connected to each other and form the output of the inverter, and whose gates are connected to each other and form the input of the inverter.

4. An oscillator device according to claim 1, wherein said resonator has the shape of a tuning fork and is arranged so that the frequency of said fundamental torsional vibrating mode is substantially equal to a multiple of 32,768 kHz.

5. An oscillator device according to claim 4, wherein it further includes a divider circuit which is connected at the output of the electronic maintenance circuit and which allows an oscillation signal to be derived at a frequency of 32,768 kHz.

6. An oscillator device according to claim 4, wherein the frequency of said fundamental torsional vibrating mode is substantially equal to 393,216 kHz.

7. An oscillator device according to claim 5, wherein the frequency of said fundamental torsional vibrating mode is substantially equal to 393,216 kHz and wherein said divider circuit is a divider-by-twelve circuit.

8. An oscillator device according to claim 1, wherein said resonator and said electronic maintenance circuit are arranged in a same case.

* * * * *